US012635319B2

(12) United States Patent　(10) Patent No.: US 12,635,319 B2
Zhou et al.　(45) Date of Patent: May 19, 2026

(54) DISPLAY MODULE AND MANUFACTURING METHOD THEREFOR

(71) Applicant: HCP TECHNOLOGY CO., LTD, Dongguan (CN)

(72) Inventors: Xiaobo Zhou, Dongguan (CN); Zhiqiang Huang, Dongguan (CN); Wenrong Zhuang, Dongguan (CN)

(73) Assignee: HCP TECHNOLOGY CO., LTD., Dongguan (CN)

( * ) Notice: Subject to any disclaimer, the term of this patent is extended or adjusted under 35 U.S.C. 154(b) by 363 days.

(21) Appl. No.: 18/272,821

(22) PCT Filed: Jul. 21, 2021

(86) PCT No.: PCT/CN2021/107592
§ 371 (c)(1),
(2) Date: Jul. 18, 2023

(87) PCT Pub. No.: WO2022/156172
PCT Pub. Date: Jul. 28, 2022

(65) Prior Publication Data
US 2024/0088333 A1　Mar. 14, 2024

(30) Foreign Application Priority Data

Jan. 19, 2021　(CN) .......................... 202110069611.1

(51) Int. Cl.
*H01L 33/56* (2010.01)
*H10H 20/854* (2025.01)
(Continued)

(52) U.S. Cl.
CPC .......... *H10H 20/854* (2025.01); *H10W 90/00* (2026.01); *H10H 20/0362* (2025.01)

(58) Field of Classification Search
CPC ............. H10H 20/854; H10H 20/0362; H10H 29/034; H10H 29/0362; H10H 29/854; H10H 29/842; H01L 25/0753
See application file for complete search history.

(56) References Cited

U.S. PATENT DOCUMENTS

2009/0236967 A1 * 9/2009 Yokoyama ........... H10H 20/851
445/3
2012/0019741 A1 1/2012 Park

FOREIGN PATENT DOCUMENTS

CN 109041403 A * 12/2018 ......... B32B 37/1284
CN 111599909 A 8/2020
(Continued)

OTHER PUBLICATIONS

Extended European Search Report for European Application No. 21920553.1, dated Mar. 17, 2025 (Mar. 17, 2025)—6 pages.
(Continued)

*Primary Examiner* — Elmito Breval
(74) *Attorney, Agent, or Firm* — CM Law; Stephen J. Weed

(57) ABSTRACT

Disclosed are a display module and a manufacturing method therefor. The display module comprises: a substrate provided with an LED chip; an encapsulating layer for encapsulating the LED chip, wherein the encapsulating layer covers the substrate and the LED chip, and an ink color layer, which covers the encapsulating layer, wherein the surface roughness of the side of the ink color layer that faces away from the encapsulating layer is Ra<1 micron, and Rz<2 microns.

8 Claims, 2 Drawing Sheets

(51) Int. Cl.
    *H10W 90/00*       (2026.01)
    *H10H 20/01*       (2025.01)

(56)            References Cited

FOREIGN PATENT DOCUMENTS

| | | | |
|---|---|---|---|
| CN | 112018226 | A | 12/2020 |
| KR | 100785031 | B1 | 12/2007 |
| TW | 1666297 | B | 7/2019 |

OTHER PUBLICATIONS

Translated International Search Report of PCT/CN2021/107592 filed Jul. 21, 2021. Mailing date of Search Report Oct. 14, 2021.

\* cited by examiner

DISPLAY MODULE AND MANUFACTURING METHOD THEREFOR

CROSS-REFERENCE TO RELATED APPLICATION

The present application claims is the United States National Stage Application under 35 U.S.C. 371 of international application. PCT/CN2021/107592 filed on Jul. 21, 2021, which claims priority to Chinese Patent Application Number 202110069611.1, filed on Jan. 19, 2021, the entirety of each of which is hereby incorporated by reference.

TECHNICAL FIELD

The present application belongs to the field of display technology, and relates to a display module and a manufacturing method therefor.

BACKGROUND

LED indoor display technology has flourishing development, while, at present, the display technologies such as projection, LCD and OLED are beset with technological difficulties more or less. The Mini&Micro LED display, as a new small-pitch high-definition display technology, has attracted much attention, especially in indoor large-screen high-definition display applications such as command centers, conference centers, security monitoring and home large-screen TVs.

There are three main technical solutions for manufacturing Mini&Micro LED small-pitch display modules: 1. SMD; 2. IMD (2 in 1, 4 in 1, etc.); and 3. chip on board (COB). Among them, COB is particularly popular because of its good display effect, high integration, simple structure and fine pitch (it is difficult for IMD and SMD to achieve the pitch of less than or equal to 1 so far). The existing COB module has three main defects: 1. a lot of manpower is required in chip picking before the screen assembling, and even if the display screen is composed of selected modules with good ink color consistency, the display screen may still have the problems of poor overall ink color consistency, specifically reflected in ink color difference from different positions, different viewing angles and different light, and white edge and black edge; 2. there is color difference between the front and the side, mainly resulting from the encapsulation structure which causes uneven light emitting; and 3. the COB module does not meet the consumption habit, and the display screens such as computers, mobile phones and splicing LCD screens are all mirror mode currently, that is, the environmental images can be clearly reflected on the display screen, which can serve as a mirror.

In the actual production process, the ink color inconsistency of display modules brings huge losses to enterprises, which requires a lot of manpower in sorting and picking, greatly increasing human costs and reducing production efficiency; meanwhile, the ink color inconsistency can easily lead to the difference of display products, which is not conducive to market promotion.

In the prior art, the Chinese invention patent with the publication number of CN112018226A, titled with "a display module and a manufacturing method therefor", discloses a similar technology, but the patented technology still has some shortcomings. Although the ink color consistency has been greatly improved, there is still a certain inconsistency of ink color. At the same time, some layers in the package structure are also ground or polished in the prior art according to, however, just the routine process in the industry, which has no substantial improvement in the overall ink color consistency.

In view of this, the researcher of the present application has done in-depth research to solve the technical problems that have plagued enterprises for a long time.

SUMMARY

An object of the present application is to provide a display module and a manufacturing method therefor, which solves or at least partially solves the problem of the ink color inconsistency.

In order to achieve the object, the present application adopts the following technical solutions.

In a first aspect, a display module is provided, comprising:
a substrate provided with a LED chip;
an encapsulation layer, wherein the encapsulation layer covers the substrate and the LED chip; and
an ink color layer, wherein the ink color layer covers the encapsulation layer, and a side of the ink color layer facing away from the encapsulation layer has a surface roughness which satisfies Ra<1 micron, and Rz<2 microns.

Optionally, the display module further comprises:
an imaging layer, wherein the imaging layer covers the ink color layer, and a side of the imaging layer facing away from the ink color layer has a surface roughness which satisfies Ra<2 microns, and Rz<4 microns.

Optionally, the encapsulation layer comprises an epoxy resin, silica gel or polyurethane;
the encapsulation layer contains a diffusion powder, a black pigment and a matting powder;
the black pigment has a mass proportion of 0.1%-5% to the encapsulation layer, and the matting powder has a mass proportion of 0.1%-5% to the encapsulation layer; and
the black pigment comprises at least one of a graphite powder, a carbon powder, iron black and a black resin.

Optionally, the ink color layer comprises a mixture of at least one of a fluorocarbon resin, an epoxy resin, silica gel and polyurethane with a black pigment;
the ink color layer further contains a diffusion powder or a matting powder; and
the black pigment has a mass proportion of 3%-80% to the ink color layer.

Optionally, the imaging layer comprises a mixture of at least one of a fluorocarbon resin, an epoxy resin, silica gel and polyurethane with a diffusion powder or a matting powder; and
the imaging layer has a thickness of 1-200 microns, and the imaging layer is a transparent layer with a transparency of 50%-100%.

In a second aspect, a manufacturing method for a display module is provided, comprising:
forming an encapsulation layer on a substrate and on a LED chip on the substrate;
forming an ink color layer on the encapsulation layer; and
planarizing a surface of the ink color layer; wherein a side of the ink color layer facing away from the encapsulation layer has a surface roughness which satisfies Ra<1 micron, and Rz<2 microns.

Optionally, an encapsulation material of the encapsulation layer is an epoxy resin, silica gel, or polyurethane;
the encapsulation material contains a diffusion powder, a black pigment and a matting powder;

the black pigment has a mass proportion of 0.1%-5% to the encapsulation material, and the matting powder has a mass proportion of 0.1%-5% to the encapsulation material; and the black pigment comprises at least one of a graphite powder, a carbon powder, iron black and a black resin.

Optionally, the ink color layer comprises a mixture of at least one of a fluorocarbon resin, an epoxy resin, silica gel and polyurethane with a black pigment;

the ink color layer further contains a diffusion powder or a matting powder; and the black pigment has a mass proportion of 3%-80% to the ink color layer.

Optionally, after planarizing the surface of the ink color layer, the manufacturing method further comprises:

forming an imaging layer on the ink color layer; and planarizing a surface of the imaging layer, wherein a side of the imaging layer facing away from the ink color layer has a surface roughness which satisfies Ra<2 microns, and Rz<4 microns.

Optionally, the imaging layer comprises a mixture of at least one of a fluorocarbon resin, an epoxy resin, silica gel and polyurethane with a diffusion powder or a matting powder; and the imaging layer has a thickness of 1-200 microns, and the imaging layer is a transparent layer with a transparency of 50%-100%.

Compared with the prior art, examples of the present application have the following beneficial effects.

Examples of the present application provide a display module and a manufacturing method therefor, which make full use of the optical principle. By controlling the surface roughness of the ink color layer, the ink color consistency of the display module can be improved, and the ink color for screen assembling can be highly consistent without chip picking, and meanwhile, the color difference of display form different angles is eliminated, presenting a high-contrast display module.

BRIEF DESCRIPTION OF DRAWINGS

In order to more clearly illustrate examples of the present application or technical solutions in the prior art, the brief introduction to the drawings that need to be used in the examples or the prior art description is as follows; obviously, the drawings described below are only some examples of the present application, and those of ordinary skill in the art may also obtain other drawings based on these drawings without creative efforts.

The structure, proportion, size, etc., shown in this specification are only used to cooperate with the content disclosed in the specification for those familiar with this technology to understand and read, but not to limit the implementation of the present application, which thus have no technical substantive significance; any structural modification, proportional change or size adjustment, without affecting the effect that can be produced and the object that can be achieved in the present application, shall also fall within the scope of the technical content disclosed in the present application.

REFERENCE LIST

10. substrate; 11. LED chip; 12. patterned light blocking layer; 13. black matrix; 20. encapsulation layer; 30. ink color layer; and 40. imaging layer.

DETAILED DESCRIPTION

In order to make the objects, characteristics and advantages of the present application more obvious and easy to understand, the technical solutions of the present application will be clearly and completely described below via the drawings in examples of the present application, and obviously, the examples described below are only a part of examples in the present application, but not all examples. Based on the examples in the present application, other examples obtained by those of ordinary skill in the art without creative efforts all fall within the protection scope of the present application.

Figure 1:
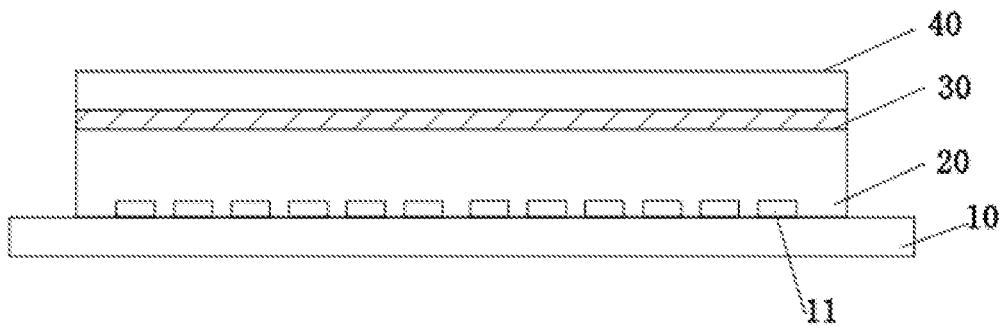
FIG. 1 is a structural diagram of a display module provided by an example of the present application.

Referring to FIG. 1, this example provides a display module, which makes full use of the optical principle. By controlling the surface roughness, different black areas of the same display module are continuously reflected internally, which looks more uniform to naked eyes, improving the ink color consistency of the display module, and the ink color for screen assembling can be highly consistent without chip picking, and meanwhile, the color difference of display form different angles is eliminated, presenting a high-contrast display module.

Specifically, the display module comprises a substrate 10, the substrate 10 is mounted with LED chips 11 inversely, the substrate 10 and the LED chips 11 are covered with an encapsulation layer 20, and a height of the encapsulation layer 20 is higher than a height of the LED chip 11.

Optionally, the substrate 10 is PCB, glass, ceramic or other materials.

An ink color layer 30 is further provided on the encapsulation layer 20, and the ink color layer 30 covers the encapsulation layer 20.

A surface of the ink color layer 30 can be planarized, so that the surface of the side of the ink color layer 30 facing away from the encapsulation layer 20 (the upper surface of the ink color layer in FIG. 1) is a mirror surface, and the roughness and planeness of the mirror surface are controlled to improve the ink color consistency of the display module. Optionally, the roughness of the mirror surface is controlled at Ra<1 micron, and Rz<2 microns. Optionally, values of Ra and Rz can be measured using a step profiler. As a preferred embodiment, the roughness Ra can be less than or equal to 0.5 microns, less than or equal to 0.1 microns or less than or equal to 0.01 microns, and Rz can be less than or equal to 0.1 microns, less than or equal to 0.05 microns or less than or equal to 0.02 microns, respectively.

It should be noted that, in order to improve the ink color consistency of the display module, a surface of the encapsulation layer 20 can be planarized before the formation of the ink color layer 30 in this example, so that the surface of the side of the encapsulation layer 20 facing away from the substrate 10 is a mirror surface. Optionally, the planarization can be achieved by polishing, grinding or smooth release film pressing. Furthermore, by controlling the roughness of the mirror at Ra<3 microns and Rz<6 microns, the display module can have a high ink color consistency. As a preferred embodiment, the roughness Ra can be less than or equal to 2 microns, less than or equal to 1 micron or less than or equal to 0.5 microns, and Rz can be less than or equal to 1 micron, less than or equal to 0.5 microns or less than or equal to 0.25 microns, respectively.

The encapsulation layer 20 comprises an epoxy resin, silica gel, or polyurethane. Optionally, the encapsulation layer contains a diffusion powder, a black pigment and a matting powder. Optionally, the black pigment has a mass proportion of 0.1%-5% to the encapsulation layer 20, and the matting powder has a mass proportion of 0.1%-5% to the encapsulation layer 20. Optionally, the black pigment comprises at least one of a graphite powder, a carbon powder, iron black and a black resin. Optionally, the encapsulation layer 20 has a thickness of 30-400 microns.

In this example, the ink color layer 30 comprises a mixture of at least one of a fluorocarbon resin, an epoxy resin, silica gel and polyurethane with a black pigment. Optionally, the ink color layer 30 further contains a diffusion powder or a matting powder. Optionally, the black pigment has a mass proportion of 3%-80% to the ink color layer 30. Optionally, the black pigment comprises at least one of a graphite powder, a carbon powder, iron black and a black resin. Optionally, the ink color layer 30 has a thickness of 1-100 microns.

As a further solution of this example, the display module further comprises an imaging layer 40 covering on the ink color layer 30. Similarly, the imaging layer 40 can be planarized, so that the surface of the side of the imaging layer 40 facing away from the ink color layer 30 is a mirror surface, and the roughness of the mirror surface is controlled at Ra<2 microns, and Rz<4 microns. As a preferred embodiment, the roughness Ra can be less than or equal to 1.5 microns, less than or equal to 0.5 microns or less than or equal to 0.1 microns, and Rz can be less than or equal to 3 microns, less than or equal to 1 micron or less than or equal to 0.2 microns, respectively, to improve the ink color consistency of the display module.

It should be noted that the imaging layer 40 comprises a mixture of at least one of a fluorocarbon resin, an epoxy resin, silica gel and polyurethane with a diffusion powder or a matting powder. Optionally, the imaging layer 40 has a thickness of 1-200 microns, and the imaging layer 40 is a transparent layer with a transparency of 50%-400%. Optionally, the imaging layer 40 has a thickness of 1-100 microns. Furthermore, the imaging layer 40 may have fingerprint resistance, collision resistance, electrostatic resistance and other functions.

Figure 2:
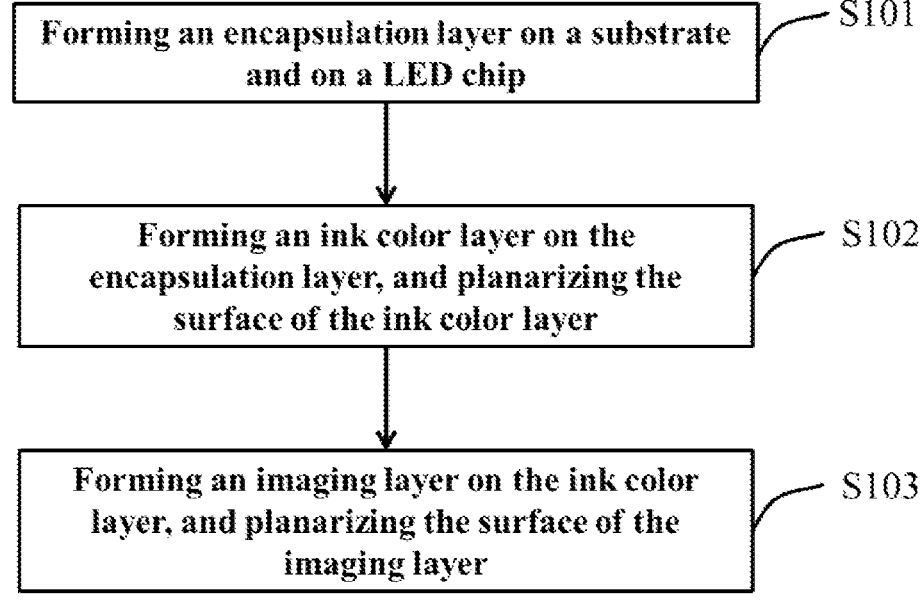
FIG. 2 is a flowchart of a manufacturing method for a display module provided by an example of the present application.

Referring to FIG. 2, another example of the present application provides a manufacturing method, which can manufacture the display module provided by the above example. Specifically, the manufacturing method comprises the following steps:

S101. an encapsulation layer 20 is formed on a substrate 10 and LED chips 11 on the substrate 10, which can be formed by spraying or laminating;

optionally, the surface of the encapsulation layer 20 is planarized; the surface of the side of the encapsulation layer 20 facing away from the substrate 10 is a mirror surface, which has a roughness satisfying Ra<3 microns and Rz<6 microns;

S102, an ink color layer 30 is formed on the encapsulation layer 20, which can be formed by spraying or laminating; the surface of the ink color layer 30 is planarized; the surface of the side of the ink color layer 30 facing away from the encapsulation layer 20 is a mirror surface, which has a roughness satisfying Ra<1 micron, and Rz<2 microns; and S103, an imaging layer 40 is formed on the ink color layer 30, which can be formed by spraying or laminating; the surface of the imaging layer 40 is planarized; the surface of the side of the imaging layer 40 facing away from the ink color layer 30 is a mirror surface, which has a roughness satisfying Ra<2 microns, and Rz<4 microns.

Since components of the encapsulation layer 20, the ink color layer 30 and the imaging layer 40 have been specified in the above example, they will not be repeated here.

Optionally, the planarization can be achieved by polishing, grinding or smooth release film pressing.

This example provides a manufacturing method which makes full use of the optical principle. By controlling the surface roughness, the ink color consistency of the display module can be significantly improved, and the ink color for screen assembling can be highly consistent without chip picking, and meanwhile, the color difference of display form different angles is eliminated presenting a high-contrast display module.

As an optional embodiment of any one of the above examples, the encapsulation layer 20 is divided into two parts, which are a bottom coating and a matte layer, respectively.

Figure 3:
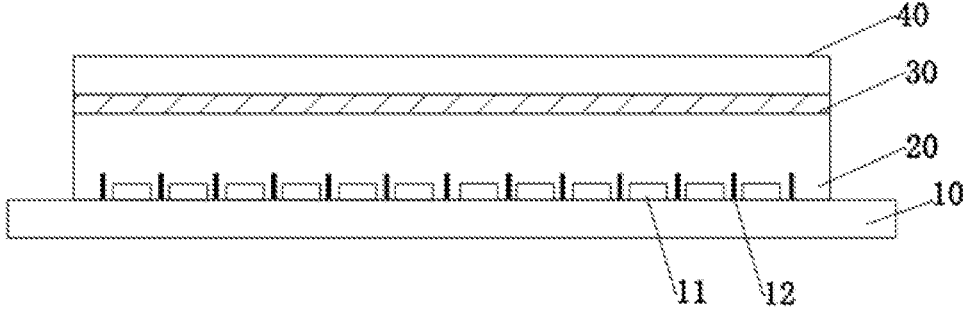
FIG. 3 is a structural diagram of another display module provided by an example of the present application.
Figure 4:
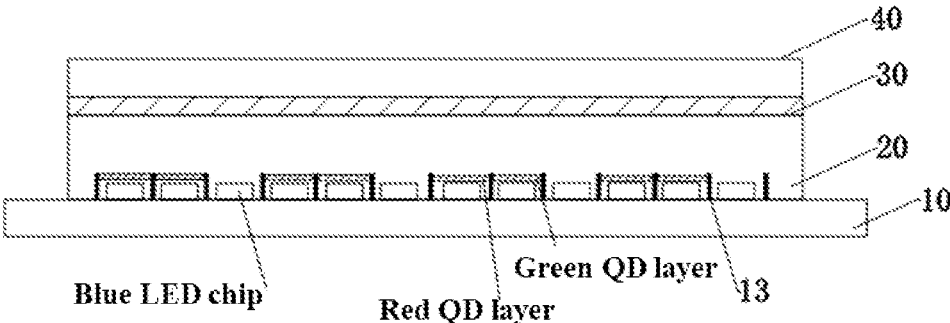
FIG. 4 is a structural diagram of another display module provided by an example of the present application.

Referring to FIG. 3 and FIG. 4, the bottom coating can form a black matrix 13, which is distributed among the LED chips 11 in the LED array. The matte layer is arranged on the bottom coating. Optionally, the bottom coating is a resin material mixed with the black pigment (carbon powder, iron black, etc.), and the matte layer is a resin material mixed with a scattering powder, a diffusion powder or a matting powder. The resin material is an epoxy resin, silica gel or polyurethane, etc.

As an optional embodiment of any one of the above examples, the LED chips 11 comprise an LED chip group, and the LED chip group is provided with a QD layer.

The substrate 10 is provided with a patterned light blocking layer 12, the LED chip unit in the LED chip group is limited in a light limiting unit of the patterned light blocking layer 12, the LED chip unit can be a pixel (RGB three chips), or a single LED chip, and a size of the light limiting unit matches a size of the LED chip unit.

As described above, the above examples are only used to illustrate the technical solutions of the present application but not to limit thereto. Although the present application is described in detail with reference to the examples, those of ordinary skill in the art should understand that the technical solutions described in the foregoing examples may still be modified or some technical features may be replaced equivalently.

What is claimed is:

1. A display module, comprising:

a substrate provided with an LED chip;

an encapsulation layer, wherein the encapsulation layer covers the substrate and the LED chip;

an ink color layer, wherein the ink color layer covers the encapsulation layer, and a side of the ink color layer facing away from the encapsulation layer has a surface roughness which satisfies Ra<1 micron, and Rz<2 microns; and an imaging layer, wherein the imaging layer covers the ink color layer, and a side of the imaging layer facing away from the ink color layer has a surface roughness which satisfies Ra<2 microns, and Rz<4 microns.

2. The display module according to claim 1, wherein the encapsulation layer comprises an epoxy resin, silica gel, or polyurethane;

the encapsulation layer contains a diffusion powder, a black pigment and a matting powder;

the black pigment has a mass proportion of 0.1%-5% to the encapsulation layer, and the matting powder has a mass proportion of 0.1%-5% to the encapsulation layer; and the black pigment comprises at least one of a graphite powder, a carbon powder, iron black and a black resin.

3. The display module according to claim 1, wherein the ink color layer comprises a mixture of at least one of a fluorocarbon resin, an epoxy resin, silica gel and polyurethane with a black pigment;

the ink color layer further contains a diffusion powder or a matting powder; and the black pigment has a mass proportion of 3%-80% to the ink color layer.

4. The display module according to claim 1, wherein the imaging layer comprises a mixture of at least one of a fluorocarbon resin, an epoxy resin, silica gel and polyurethane with a diffusion powder or a matting powder; and the imaging layer has a thickness of 1-200 microns, and the imaging layer is a transparent layer with a transparency of 50%-100%.

5. A manufacturing method for a display module, comprising:

forming an encapsulation layer on a substrate and on a LED chip on the substrate;

forming an ink color layer on the encapsulation layer; and planarizing a surface of the ink color layer; wherein a side of the ink color layer facing away from the encapsulation layer has a surface roughness which satisfies Ra<1 micron, and Rz<2 microns;

forming an imaging layer on the ink color layer; and planarizing a surface of the imaging layer, wherein a side of the imaging layer facing away from the ink color layer has a surface roughness which satisfies Ra<2 microns, and Rz<4 microns.

6. The manufacturing method according to claim 5, wherein an encapsulation material of the encapsulation layer is an epoxy resin, silica gel, or polyurethane;

the encapsulation material contains a diffusion powder, a black pigment and a matting powder;

the black pigment has a mass proportion of 0.1%-5% to the encapsulation material, and the matting powder has a mass proportion of 0.1%-5% to the encapsulation material; and the black pigment comprises at least one of a graphite powder, a carbon powder, iron black and a black resin.

7. The manufacturing method according to claim 5, wherein the ink color layer comprises a mixture of at least one of a fluorocarbon resin, an epoxy resin, silica gel and polyurethane with a black pigment;

the ink color layer further contains a diffusion powder or a matting powder; and the black pigment has a mass proportion of 3%-80% to the ink color layer.

8. The manufacturing method according to claim 5, wherein the imaging layer comprises a mixture of at least one of a fluorocarbon resin, an epoxy resin, silica gel and polyurethane with a diffusion powder or a matting powder; and the imaging layer has a thickness of 1-200 microns, and the imaging layer is a transparent layer with a transparency of 50%-100%.

* * * * *